(12) United States Patent
Tang et al.

(10) Patent No.: US 9,538,654 B2
(45) Date of Patent: Jan. 3, 2017

(54) CONDUCTIVE FILM, METHOD FOR MANUFACTURING THE SAME, AND TOUCH SCREEN INCLUDING THE SAME

(71) Applicant: SHENZHEN O-FILM TECH CO., LTD, Shenzhen (CN)

(72) Inventors: Genchu Tang, Shenzhen (CN); Shengcai Dong, Shenzhen (CN); Wei Liu, Shenzhen (CN); Bin Tang, Shenzhen (CN)

(73) Assignee: Shenzhen O-film Tech Co., Ltd., Shenzhen (CN)

( * ) Notice: Subject to any disclaimer, the term of this patent is extended or adjusted under 35 U.S.C. 154(b) by 0 days.

(21) Appl. No.: 13/968,315

(22) Filed: Aug. 15, 2013

(65) Prior Publication Data

US 2014/0293146 A1 Oct. 2, 2014

Related U.S. Application Data

(63) Continuation of application No. PCT/CN2013/079141, filed on Jul. 10, 2013.

(30) Foreign Application Priority Data

Mar. 30, 2013 (CN) .......................... 2013 1 0109644

(51) Int. Cl.
*G06F 3/041* (2006.01)
*H05K 1/11* (2006.01)
(Continued)

(52) U.S. Cl.
CPC ............... *H05K 1/117* (2013.01); *G06F 3/044* (2013.01); *G06F 2203/04103* (2013.01);
(Continued)

(58) Field of Classification Search
CPC .......... G06F 3/041; G06F 3/042; G06F 3/043; G06F 3/044; G06F 3/045; G06F 3/046; G06F 3/0488; G06F 3/04883; G06F 3/04886; G06F 3/0416; G06F 3/0421; G06F 3/0412; G06F 3/04109; G06F 3/03545; G06F 3/0418; G06F 3/0436; G06F 3/0433
(Continued)

(56) References Cited

U.S. PATENT DOCUMENTS

2012/0327021 A1* 12/2012 Ryu et al. ..................... 345/174
2013/0038571 A1  2/2013 Ho et al. ....................... 345/174
(Continued)

FOREIGN PATENT DOCUMENTS

CN    102645996 A    8/2012
CN    102830851 A    12/2012
(Continued)

OTHER PUBLICATIONS

Chinese International Search Report of corresponding International PCT Application No. PCT/CN2013/079141, dated Jan. 2, 2014.
(Continued)

*Primary Examiner* — Kent Chang
*Assistant Examiner* — Mark Edwards
(74) *Attorney, Agent, or Firm* — Hodgson Russ LLP

(57) ABSTRACT

The present invention provides a conductive film that includes a substrate, a first matrix layer, a first conductive layer, a second matrix layer, a second conductive layer, a light-shielding layer, a first lead electrode and a second lead electrode. A first grid groove and a second grid groove are formed in the first matrix layer and the second matrix layer, respectively, and the first grid groove and the second grid groove are filled with conductive materials, to form the first conductive layer and the second conductive layer, respectively. Accordingly, the first matrix layer and the second
(Continued)

matrix layer may provide protection for the first conductive layer and the second conductive layer, and thus can improve the production yield. Furthermore, the present invention also provides a method for manufacturing the conductive film and a touch screen including the conductive film.

9 Claims, 5 Drawing Sheets

(51) Int. Cl.
  *G06F 3/044* (2006.01)
  *H05K 3/12* (2006.01)
  *H05K 3/40* (2006.01)
(52) U.S. Cl.
  CPC ......... *H05K 3/1258* (2013.01); *H05K 3/4053* (2013.01); *H05K 2201/0108* (2013.01); *H05K 2201/09481* (2013.01)
(58) Field of Classification Search
  USPC ................................ 345/173–178; 178/18.01
  See application file for complete search history.

(56) References Cited

U.S. PATENT DOCUMENTS

| | | | | |
|---|---|---|---|---|
| 2013/0038572 A1* | 2/2013 | Frey et al. | | 345/174 |
| 2013/0076692 A1 | 3/2013 | Saitou | | 345/174 |
| 2013/0082961 A1* | 4/2013 | Wang et al. | | 345/173 |
| 2014/0041904 A1* | 2/2014 | Pedder | | 174/251 |
| 2014/0152917 A1* | 6/2014 | Lee et al. | | 349/12 |

FOREIGN PATENT DOCUMENTS

| | | | |
|---|---|---|---|
| CN | 102903423 A | 1/2013 |
| CN | 102930922 A | 2/2013 |
| CN | 203179573 U | 9/2013 |
| CN | 103198885 B | 12/2014 |
| JP | 2012-109170 A | 6/2012 |
| JP | 2012-247852 A | 12/2012 |
| KR | 10-1071159 B1 | 10/2011 |
| TW | 201207524 A1 | 2/2012 |
| TW | M442544 U1 | 12/2012 |

OTHER PUBLICATIONS

Chinese First Examination Report of corresponding China Application No. 201310109644.X, dated Dec. 18, 2013.
Korea Examination Report of corresponding Korea patent application No. 10-2013-7026483, dated Aug. 27, 2014.
Taiwan Examination Report of corresponding Taiwan patent Application No. 102130451, dated Feb. 24, 2015.

* cited by examiner

CONDUCTIVE FILM, METHOD FOR MANUFACTURING THE SAME, AND TOUCH SCREEN INCLUDING THE SAME

CROSS-REFERENCE TO RELATED APPLICATIONS

This application is a continuation of International Application No. PCT/CN2013/079141, filed on Jul. 10, 2013, which claims the priority benefit of China Patent Application No. 201310109644.X, filed on Mar. 30, 2013. The contents of the above identified applications are incorporated herein by reference in their entirety.

FIELD OF THE TECHNOLOGY

The present invention relates to electronic technology and, in particular, to a conductive film, a method for manufacturing the same, and a touch screen including the same.

BACKGROUND

In daily life, capacitive touch screens have been widely used in various electronic products, which bring great convenience to people's lives. With increasing demand for user experience, electronic products have the tendency becoming lighter and thinner. Touch screen is an important factor to determine whether an electronic device can be made thin. Therefore, with the demand for lightweight and thin electronic products, touch screens are also gradually developed in the direction of becoming lighter and thinner. One Glass Solution (OGS, i.e., an integrative touch control) is an important approach of achieving light and thin touch screens. The main design idea of OGS is to directly form an ITO conductive film and a sensor on a protective glass, so the glass can play dual roles of both a protective glass and a touch sensor.

When manufacturing a touch screen, a conductive film needs to be made first, and then a display module is adhered to the conductive film. In a general OGS process, usually a conductive layer (typically an ITO layer) is directly formed on protective glass, so as to obtain a conductive film for manufacturing a touch screen. Therefore, in a conductive film obtained according to the conventional process, the conductive layer protrudes from the glass surface. The conductive layer protruding from the glass surface can be easily scratched due to general soft nature of the conductive material, such as ITO. Thus, when adhering a display module, the conductive layer may be scratched, leading to damage of the conductive film, and thus lowing production yield.

SUMMARY

Based on the above, it is necessary to provide a conductive film which can increase production yield, a method for manufacturing the same, and a touch screen including the same.

A conductive film includes:

a substrate having a first surface and a second surface opposite to the first surface;

a first matrix layer adhered to the first surface, wherein the first matrix layer is formed by curing a gel coating, and a first grid groove is formed on a side of the first matrix layer away from the substrate, with the first grid groove being filled with a conductive material to form a first conductive layer;

a second matrix layer adhered to the side of the first matrix layer away from the substrate, wherein the second matrix layer is formed by curing a gel coating, and a second grid groove is formed on a side of the second matrix layer away from the first matrix layer, with the second grid groove being filled with a conductive material to form a second conductive layer; and a light-shielding layer adhered to an edge of the side of the second matrix layer away from the first matrix layer, wherein a second non-visible region is formed in an area where the second matrix layer is adhered with the light-shielding layer, and a first non-visible region is formed in a projection area of the light-shielding layer on the first matrix layer, with the first grid groove extending to the first non-visible region and the second grid groove extending to the second non-visible region;

wherein a first through-hole is formed in the light-shielding layer, the first through-hole runs through the light-shielding layer and the second matrix layer, and communicates with the first grid groove, and the first through-hole is filled with a conductive material to form a first lead electrode, the first lead electrode is electrically connected to the first conductive layer; and there is a second lead electrode on a surface of the light-shielding layer, and the second lead electrode is electrically connected to the second conductive layer.

In one embodiment, the second lead electrode is formed as a lead by etching, and a conductive material of the lead is electrically connected to a conductive material of the second conductive layer; or a second through-hole is formed in the light-shielding layer that runs through the light-shielding layer and communicates with the second grid groove, and the second through-hole is filled with a conductive material that is electrically connected to the conductive material of the second conductive layer.

In one embodiment, a thickness of the first conductive layer is not greater than a depth of the first grid groove, and a thickness of the second conductive layer is not greater than a depth of the second grid groove.

In one embodiment, the conductive material is silver.

In one embodiment, the first grid groove and the second grid groove have a width of 1 to 5 microns, a depth of 2 to 6 microns, and a depth-to-width ratio of greater than 1. The first conductive layer and the second conductive layer have a transmittance of greater than 85%.

In one embodiment, the light-shielding layer has a thickness of 1 to 10 microns.

In one embodiment, the light-shielding layer is an ink layer or a black photoresist layer.

In one embodiment, the substrate is glass.

In one embodiment, grids of the first grid groove and of the second grid groove are random grids.

A touch screen includes:

a conductive film as described according to any one of the above preferred embodiments;

a display module adhered to a side of the second matrix layer away from the first matrix layer by optical glue.

A method for manufacturing a conductive film includes the following steps:

providing a substrate having a first surface and a second surface opposite to the first surface;

coating the first surface of the substrate with a gel, curing the gel to form a first matrix layer, and forming a first grid groove on a side of the first matrix layer that is away from the substrate;

filling the first grid groove with a conductive material to form a first conductive layer;

coating a gel on a side of the first matrix layer side that is away from the substrate, curing the gel to form a second matrix layer, and forming a second grid groove in the second matrix layer;

filling the second grid groove with a conductive material to form a second conductive layer;

coating a light-shielding material on an edge of a side of the second matrix layer that is away from the first matrix layer, to form an annular light-shielding layer;

forming a first through-hole and a second through-hole in the light-shielding layer, with the first through-hole communicating with the first grid groove, and the second through-hole communicating with the second grid groove;

filling the first through-hole and the second through-hole with a conductive material, to respectively form a first lead electrode that is electrically connected to the first conductive layer and a second lead electrode that is electrically connected to the second conductive layer.

Compared with a conventional conductive film, the above conductive film has at least the following advantages:

1. Since the first conductive layer and the second conductive layer are respectively positioned within the first grid groove and the second grid groove, the first conductive layer and the second conductive layer are respectively wrapped by the first matrix layer and the second matrix layer. Therefore, the first matrix layer and the second matrix layer can provide protection for the first conductive layer and second conductive layer, to prevent the first conductive layer and the second conductive layer from being scratched during the manufacture of a touch screen, and thus to enhance production yield; and 2. Since an edge of the substrate has a light-shielding layer, the first lead electrode and the second lead electrode can be arranged in the first non-visible region and the second non-visible region that are formed by projection of the light-shielding layer. Thus, when assembling into a touch screen, wirings of the first lead electrode and the second lead electrode cannot be observed from the front of the screen, which can improve the appearance of a product.

DETAILED DESCRIPTION

Figure 1:
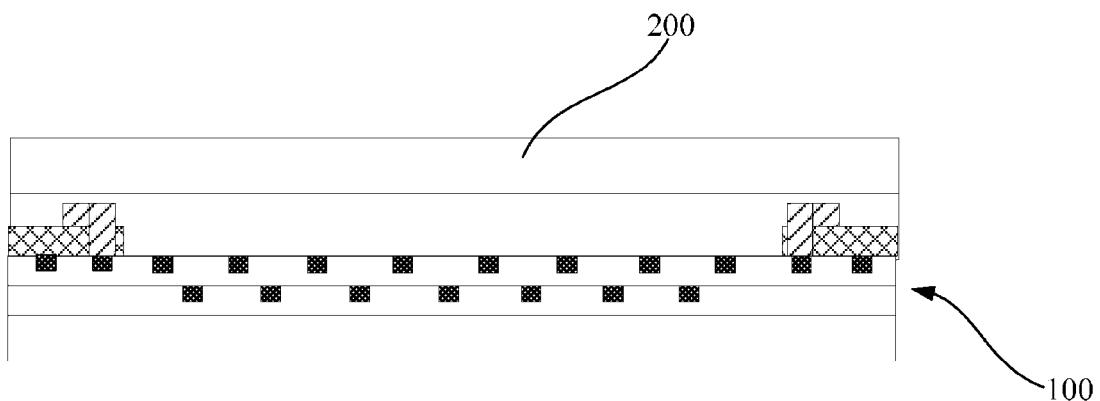
FIG. 1 is a schematic diagram showing the layer structure of a touch screen according to a preferred embodiment of the present invention.

In order to facilitate understanding the invention, the following will describe the present invention more comprehensively with reference to the accompanying drawings. Preferred embodiments of the present invention are shown in the drawings. However, the present invention can be implemented in many different forms, and is not limited to the embodiments described herein. These embodiments are presented solely for the purpose of providing thorough and comprehensive understanding of the disclosure of the present invention.

It should be appreciated that, when an element is described as being "fixed to" another element, the former can be directly fixed to the latter or there can be other element(s) connected between the former and the latter. When an element is described as being "connected" to another element, the former can be directly connected to the latter or there can be other element(s) connected between the former and the latter.

Unless otherwise defined, all technical and scientific terms as used herein have the same meanings as those commonly understood by a person skilled in the art to which the present invention pertains. The terms as used in the specification of the present invention are solely for the purpose of describing the specific embodiments, but not intended to limit the present invention. As used herein, the term "and/or" includes any and all combinations of one or more of the associated listed items.

Refer to FIG. 1, in accordance with a preferred embodiment of the present invention, a touch screen 10 including a conductive film 100 and a display module 200 is shown. The display module 200 is adhered to the conductive film 100 via optical glue.

Figure 2:
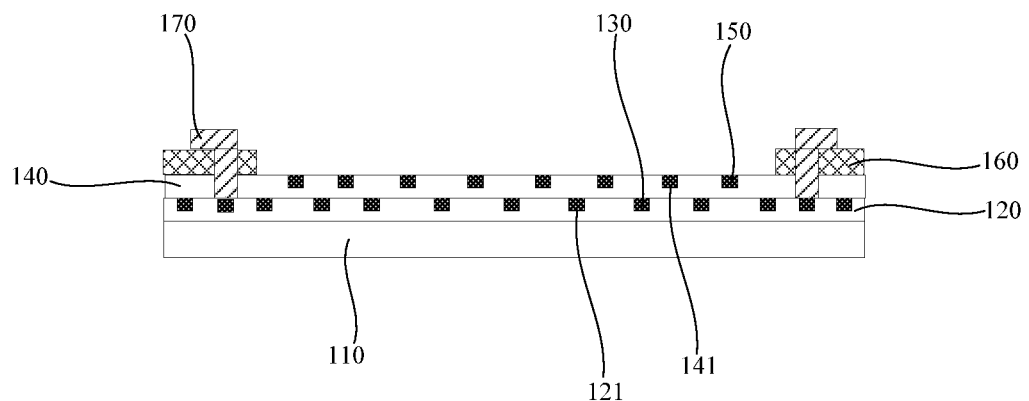
FIG. 2 is a schematic diagram showing a layer structure of the conductive film of the touch screen shown in FIG. 1.
Figure 3:
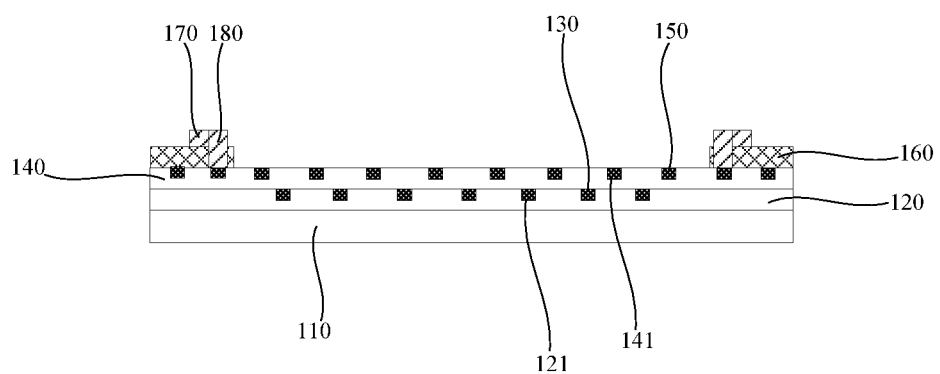
FIG. 3 is a schematic diagram showing the layer structure of the conductive film shown in FIG. 2, from another visual angle.
Figure 4:
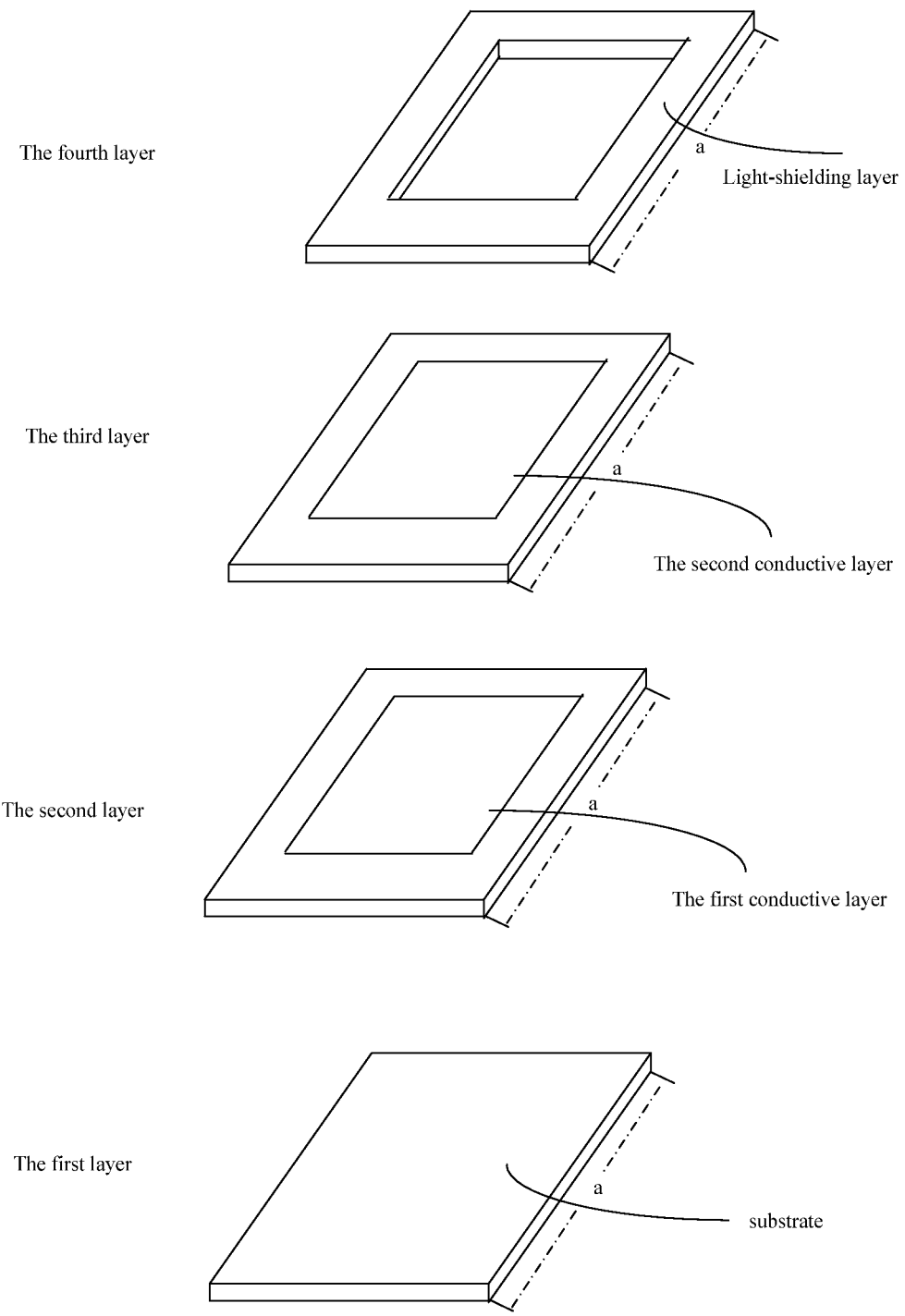
FIG. 4 is an isometric exploded view of the conductive film shown in FIG. 2.

Refer to FIGS. 2, 3 and 4, the conductive film 100 includes a substrate 110, a first matrix layer 120, a first conductive layer 130, a second matrix layer 140, a second conductive layer 150, a light-shielding layer 160, a first lead electrode 170, and a second lead electrode 180.

The substrate 110 has a plate-like structure, including a first surface (no reference number is assigned) and a second surface (no reference number is assigned). The first surface and the second surface are arranged opposite to each other. In this embodiment, the substrate 110 is a glass substrate, and the glass is subjected to reinforced treatment before it is used to manufacture the substrate 110, so the substrate 110 thus obtained has high strength and excellent protection effect. It should be appreciated that in other embodiments, the substrate 110 can be a film made of other materials such as polybutylene terephthalate (PBT), polymethyl methacrylate (PMMA), polycarbonate (PC) plastic and polyethylene terephthalate (PET). When the conductive film 100 is used to manufacture a touch screen, the material for the substrate 110 is preferably a transparent insulating material.

The first matrix layer 120 is adhered to the first surface of the substrate 110. The first matrix layer 120 is formed by curing a gel coated on the substrate 110 and, thus, has a smaller thickness than the substrate 110. Furthermore, the first matrix layer 120 is made of a transparent insulating material that is different from the material of the substrate 110.

Furthermore, the first matrix layer 120 defines a first grid groove 121 on one side away from the substrate 110. A conductive material is filled in the first grid groove 121 to form the first conductive layer 130. Since the first conductive layer 130 is within the first grid groove 121, the first conductive layer 130 can be wrapped by the first matrix layer 120. Therefore, the first matrix layer 120 can protect the first conductive layer 130 from being scratched in subsequent adhering processes.

Specifically, the conductive material is filled in the first grid groove 121 to form the first conductive layer 130, which is in a form of conductive grids formed by the intercrossing of conductive thin lines. Since ITO has relatively large resistance when it used in a conductive film with large size, the conventional touch screen manufactured by using a conductive film containing ITO conductive layer has poor sensitivity. The grid-like structure can effectively reduce the resistance, so that the resistance of the first conductive layer 130 is small, and thus the sensitivity of the product obtained can be improved.

The second matrix layer 140 is adhered to a side of the first matrix layer 120 that is away from the substrate 110. The second matrix layer 140 is formed by curing a gel coated on the first matrix layer 120. The second matrix layer 140 has smaller thickness than the substrate 110. Specifically, the side of the second matrix layer 140 that is away from the first matrix layer 120 is adhered with the display module 200 so that the display module 200 is adhered to the conductive film 100.

Furthermore, the second matrix layer 140 on its one side away from the first matrix layer 120 is formed with a second grid groove 141. A conductive material is filled in the second grid groove 141 to form the second conductive layer 150. Since the second conductive layer 150 is within the second grid groove 141, the second conductive layer 150 can be wrapped by the second matrix layer 140. Thus, the second matrix layer 140 can protect the second conductive layer 150 so as to prevent the second conductive layer 150 from being scratched in subsequent adhering processes.

Specifically, the conductive material is filled in the second grid groove 141 to form the first conductive layer 170, which is in the form of conductive grids formed by the intercrossing of conductive thin lines. Since ITO has relatively large resistance when it used to manufacture a conductive film with large size, the conventional touch screen manufactured by using a conductive film containing ITO conductive layer has poor sensitivity. The grid-like structure can effectively reduce the resistance, so that the resistance of the second conductive layer 140 is small, and thus the sensitivity of the product obtained can be improved.

The light-shielding layer 160 is adhered to an edge of a side of the second matrix layer 140 away from the first matrix layer 120. The light-shielding layer 160 is formed by a light-shielding material coated on the edge of the surface of the second matrix layer 140, and the formed light-shielding layer 160 has an annular layered structure. Since the light-shielding layer 160 is made of an opaque material, it can form shadows on edges of the first matrix layer 120 and the second matrix layer 140. A second non-visible region (no reference number is assigned) is formed in an area of the second matrix layer 140 adhered with the light-shielding layer 160, and a first non-visible region is formed in a projection area of the light-shielding layer 160 on the first matrix layer 120 (not shown). The first grid groove 121 extends to the first non-visible region and the second grid groove 141 extends to the second non-visible region.

In this embodiment, the light-shielding layer 160 is an ink layer or a black photoresist layer, and has a thickness of 1 to 10 microns. The light-shielding layer 160 can have a thickness of 6 microns when it is the ink layer, and the light-shielding layer 160 can have a thickness of 1 micron when it is the black photoresist layer, so as to have a thinner thickness.

Light-shielding layer 160 is formed with the first through-hole (not shown). The first through-hole runs through the light-shielding layer 160 and the second matrix layer 140, and communicates with the first grid groove 121.

The first through-hole is filled with a conductive material to form the first lead electrode 170. Since the first through-hole communicates with the first grid groove 121, the first lead electrode 170 formed in the first through-hole is electrically connected to first conductive layer 130. The first lead electrode 170 leads the first conductive layer 130 to a surface of the light-shielding layer 160, so as to facilitate electrical connection of the first conductive layer 130 to a controller of an electronic device.

The second lead electrode 180 is formed on the surface of the light-shielding layer 160, and is electrically connected to the second conductive layer 150.

In this embodiment, the second lead electrode 180 is formed as a lead by etching, and a conductive material of the lead is electrically connected to a conductive material of the second conductive layer 150. Furthermore, in other embodiments, the light-shielding layer can also be formed with the second through-hole (not shown), and the second through-hole runs through the light-shielding layer 160 and communicates with the second grid groove 141. The second through-hole is filled with a conductive material to form the second lead electrode 180. Since the second through-hole communicates with the second grid groove 141, the second lead electrode 180 formed in the second through-hole can be electrically connected to the second conductive layer 150. The second conductive layer is electrically connected to the second lead electrode. The second lead electrode 180 leads the second conductive layer 150 to the surface of the light-shielding layer 160, to facilitate electrical connection of the second conductive layer 150 with a controller of an electronic device.

When the conductive film 100 is used to manufacture a touch screen of an electronic device, the first lead electrode 170 and the second lead electrode 180 are used to electrically connect the first conductive layer 130 and the second conductive layer 150 with a controller of the electronic device, so that the controller can detect touch operations on the touch screen. Since both the first lead electrode 170 and the second lead electrode 180 are located on the surface of the light-shielding layer 160, wirings of the first lead electrode 170 and the second lead electrode 180 cannot be observed on the obtained electronic device, which can improve the appearance of a product.

In this embodiment, the conductive materials for forming the first conductive layer 130, the second conductive layer 150, the first lead electrode 170, and the second lead electrode 180 is silver. Silver is a good conductor with low resistivity, and thus can further improve the sensitivity. It should be appreciated that in other embodiments, a wire material can be a polymer conductive material, graphene, carbon nanotube, indium tin oxide (ITO) and so on.

Figure 5:
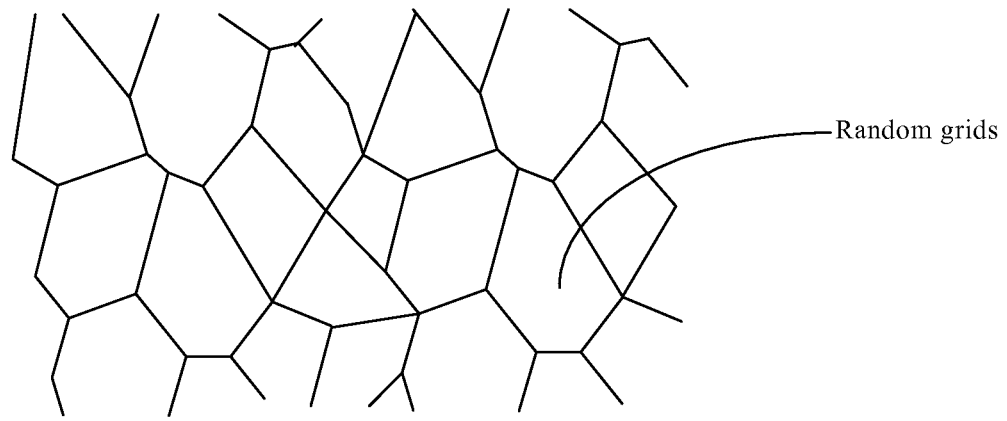
FIG. 5 is a schematic diagram showing grid shape of the first conductive layer and the second conductive layer of the conductive film shown in FIG. 2.
Figure 6:
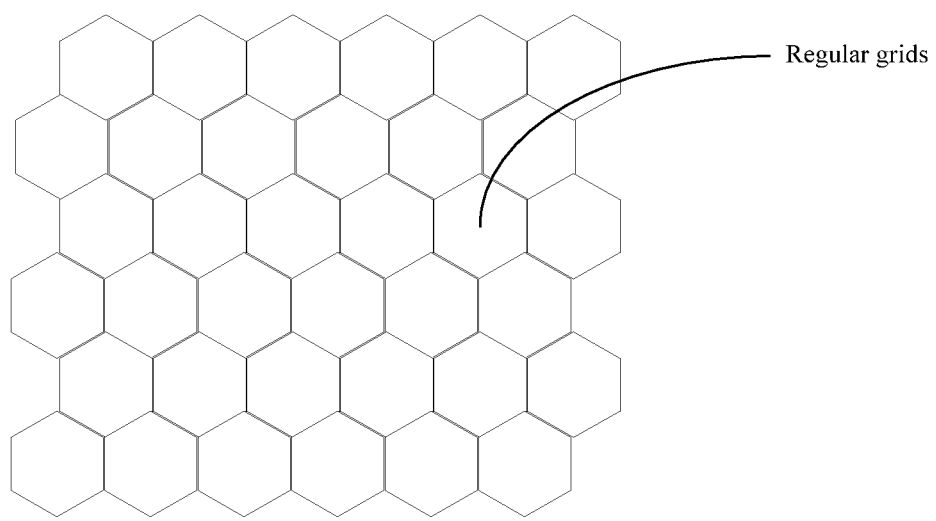
FIG. 6 is a schematic diagram showing grid shape of the first conductive layer and the second conductive layer according to another embodiment.

Refer to FIG. 5, in this embodiment, grids of the first grid groove 121 and the second grid groove 141 are random grids. Therefore, the first conductive layer 130 and the second conductive layer 150 formed by them also have random grids. Due to the random distribution of the center of the random grids, there is no interference phenomenon between the first conductive layer 130 and the second conductive layer 150, which can avoid the generation of the moire fringe and increase the display effect of a display screen including the conductive film 100. It should be appreciated that, as shown in FIG. 6, in other embodiments, grids of both the first grid groove 121 and the second grid groove 141 can be a regular polygon, and the first conductive layer 130 and second conductive layer 150 have staggered grid centers, to avoid the generation of the moire fringe.

In this embodiment, a thickness of the first conductive layer 130 is not greater than a depth of the first grid groove 121, and a thickness of the second conductive layer 150 is not greater than a depth of the second grid groove 141. Accordingly, the first conductive layer 130 and the second conductive layer 150 can be insulated by the first matrix layer 120 and the second matrix layer 140, respectively, and thus a capacitor structure is formed between the first conductive layer 130 and the second conductive layer 150. It should be appreciated that in other embodiments, the first conductive layer 130 and the second conductive layer 150 can be insulated by adding insulating layer(s) between the first matrix layer 120 and the second matrix layer 140.

In this embodiment, the first grid groove 121 and the second grid groove 141 both have a width of between 1 and 5 microns, a height of between 2 and 6 microns, and a depth-to-width ratio of greater than 1. Thus, the first conductive layer 130 and the second conductive layer 150 have a transmittance of greater than 85%, and the light through the conductive layer will not have too many losses, so that a display screen containing the conductive film 100 will has better display effect.

Comparing with a conventional conductive film, the conductive film 100 has at least the following advantages:

1. Since the first conductive layer 130 and the second conductive layer 150 are respectively located within the first grid groove 121 and the second grid groove 141, the first conductive layer 130 and the second conductive layer 150 are respectively wrapped by the first matrix layer 120 and the second matrix layer 140. Therefore, the first matrix layer 120 and the second matrix layer 140 can provide protection for the first conductive layer 130 and second conductive layer 150, so as to prevent the first conductive layer 130 and the second conductive layer 150 from being scratched during the manufacture of a touch screen, and thus to enhance production yield; and 2. Since an edge of the substrate 110 has the light-shielding layer 160, the first lead electrode 170 and the second lead electrode 180 can be arranged in the first non-visible region and the second non-visible region that are formed by projection of the light-shielding layer 160. Thus, when assembling into a touch screen 10, wirings of the first lead electrode 170 and the second lead electrode 180 cannot be observed from the front of the screen, which can improve the appearance of the product.

Further, the present invention also provides a method for manufacturing a conductive film.

Figure 7:
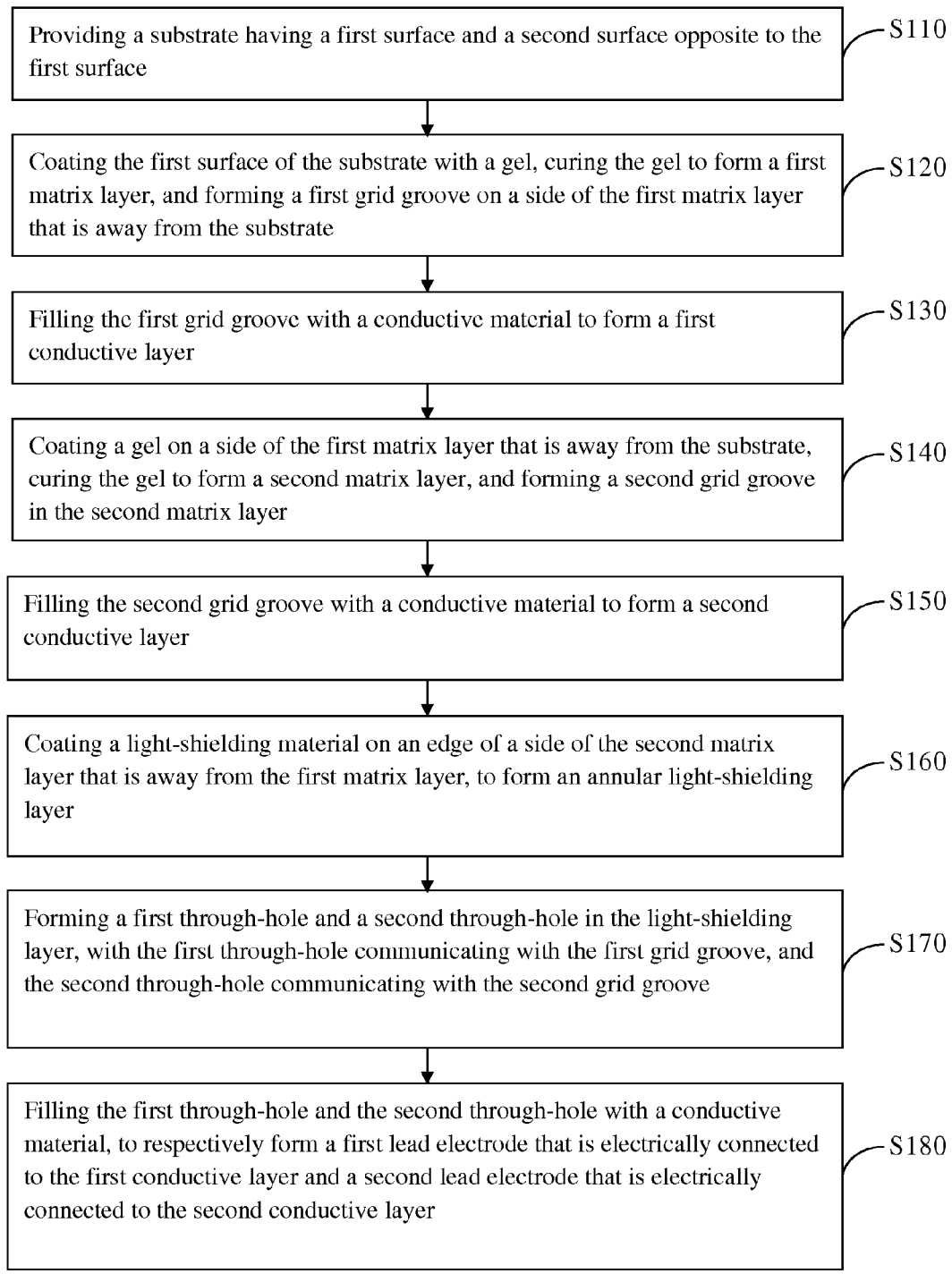
FIG. 7 is a schematic flow diagram showing a method for manufacturing the conductive film according to an embodiment.

Refer to FIG. 7, in one embodiment, a method for manufacturing the conductive film includes the steps S110-S180:

Step S110, providing a substrate, the substrate having a first surface and a second surface opposite to the first surface.

In this embodiment, the material of the substrate is glass. Moreover, the glass is subjected to a reinforced treatment, making the substrate can well play a protective role. It should be appreciated that in other embodiments, the substrate can be other materials, such as polybutylene terephthalate (PBT), polymethyl methacrylate (PMMA), polycarbonate (PC) plastic, polyethylene terephthalate (PET) and so on.

Step S120, coating the first surface of the substrate with a gel, curing the gel to form a first matrix layer, and forming a first grid groove on a side of the first matrix layer away from the substrate.

Specifically, the first matrix layer is adhered to the first surface of the substrate. Further, in this embodiment, the first grid groove can be formed by impression on a side of the first matrix layer that is away from the substrate, and a depth of the first grid groove is less than a thickness of the first matrix layer.

Step S130, filling the first grid groove with a conductive material in to form a first conductive layer.

In this embodiment, the conductive material in the first grid groove forms intercrossed conductive thin lines, which forms conductive grids. Specifically, a conductive silver paste is filled in the first grid groove and then is cured by sintering, to form conductive grids.

Further, a thickness of the first conductive layer is less than a depth of the first grid groove. Accordingly, the first conductive layer is wrapped in the first matrix layer, and thus is protected by the first matrix layer, to avoid the first conductive layer being scratched in subsequent adhering processes.

Step S140, coating a gel on a side of the first matrix layer that is away from the substrate, curing the gel to form a second matrix layer, and forming a second grid groove in the second matrix layer.

Specifically, the material for forming the second matrix layer is the same as that for forming the first matrix layer. Further, in this embodiment, the second grid groove can be formed by impression on a side of the second matrix layer that is away from the first matrix layer, and a depth of the second grid groove is less than a thickness of the second matrix layer.

Step S150, filling the second grid groove with a conductive material to form a second conductive layer.

In this embodiment, the conductive material filled in the second grid groove forms intercrossed metal conductive thin lines, which forms conductive grids. Specifically, a conductive silver paste is filled in the second grid groove and then is cured by sintering, to form conductive grids.

Step S160, coating a light-shielding material on an edge of a side of the second matrix layer that is away from the first matrix layer, to form an annular light-shielding layer.

Specifically, the light-shielding layer is made of an opaque material, and thus forms shadows at edges of the first matrix layer, the second matrix layer and the substrate. A first non-visible region is formed in a projection area of the light-shielding layer on the first matrix layer, and a second non-visible region is formed in an area where the second matrix layer is adhered with the light-shielding layer. In this embodiment, the material for forming the light-shielding layer can be an ink or a black photoresist, and has a thickness of between 1 and 10 microns. The light-shielding layer can have a thickness of 6 microns when it is formed of the ink, and the light-shielding layer can have a thickness of 1 micron when it is formed of the black photoresist. Therefore, the light-shielding layer formed of the black photoresist can further reduce the thickness of the conductive film.

Step S170, forming a first through-hole and a second through-hole in the light-shielding layer, with the first through-hole communicating with the first grid groove, and the second through-hole communicating with the second grid groove.

Specifically, the first through-hole and the second through-hole are formed in the light-shielding layer by an exposure and developing method, wherein the first through-hole runs through the light-shielding layer and the second matrix layer, and communicates with the first grid groove, and the second through-hole runs through the light-shielding layer and communicates with the second grid groove.

Step S180, filling the first through-hole and the second through-hole with a conductive material, to form the first lead electrode that is electrically connected to the first conductive layer and the second lead electrode that is electrically connected to the second conductive layer, respectively.

Specifically, a conductive silver paste is filled in the first through-hole and the second through-hole, respectively, and then is cured, to form the first lead electrode and the second lead electrode, respectively. Due to the first through-hole communicating with the first grid groove, the first lead electrode formed in the first through-hole is electrically connected to the first conductive layer. Similarly, the second lead electrode is electrically connected to the second conductive layer.

Through the first through-hole and the second through-hole, respectively, the first lead electrode and the second lead electrode are leaded to a surface of the light-shielding layer. When the conductive film 100 is used to manufacture a touch screen, wirings of the first lead electrode and the second lead electrode are formed on surface of the light-shielding layer, and are electrically connected to a flexible circuit board. Because the first lead electrode and the second lead electrode are located on the surface of the light-shielding layer, the wiring of the lead cannot be observed from the front of a touch screen, which can improve the appearance of a product.

Comparing with the conventional method for manufacturing a conductive film, the first conductive layer and the second conductive layer of the conductive film obtained by the above method, are wrapped in the first matrix layer and the second matrix layer, respectively. Accordingly, the first matrix layer and the second matrix layer can provide protection for the first conductive layer and the second conductive layer, respectively, to prevent the first conductive layer and the second conductive layer from being scratched in the manufacture of a touch screen, and thus can improve the production yield. Furthermore, there is a light-shielding layer arranged at the edge of the second matrix layer, and both the first lead electrode and the second lead electrode can be leaded to the surface of the light-shielding layer. Therefore, when assembling into a touch screen, wirings of the first lead electrode and the second lead electrode cannot be observed from the front of the screen, which can improve the appearance of the product.

The above embodiments merely describe several implementing modes of the present invention with specific details, but are not intended to limit the scope of the present invention. It should be recognized that various modifications and improvements may be made to the present invention by persons skilled in the art without departing from the concept of the present invention, modifications and improvements also fall within the scope of the invention. The scope of the invention should be subject to the appended claims.

What is claimed is:

1. A conductive film comprising:
   a substrate having a first surface and a second surface opposite to the first surface;
   a first matrix layer adhered to the first surface, wherein the first matrix layer is formed by curing a gel coating, and a first grid groove is formed on a side of the first matrix layer away from the substrate, with the first grid groove being filled with a conductive material to form a first conductive layer;
   a second continuous matrix layer directly adhered to the side of the first matrix layer away from the substrate, wherein the second continuous matrix layer is formed by curing a gel coating, and a second grid groove is formed on a side of the second continuous matrix layer away from the first matrix layer, with the second grid groove being filled with a conductive material to form a second conductive layer; and
   a light-shielding layer adhered to an edge of the side of the second continuous matrix layer away from the first matrix layer, wherein a second non-visible region is formed in an area where the second continuous matrix layer is adhered with the light-shielding layer, and a first non-visible region is formed in a projection area of the light-shielding layer on the first matrix layer, with the first grid groove extending to the first non-visible region, and the second grid groove extending to the second non-visible region;
   wherein a first through-hole is formed in the light-shielding layer, the first through-hole runs through the light-shielding layer and the second continuous matrix layer, and communicates with the first grid groove, and the first through-hole is filled with a conductive material to form a first lead electrode, the first lead is electrically connected to the first conductive layer; and there is a second lead electrode on a surface of the light-shielding layer, and the second lead electrode is electrically connected to the second conductive layer, a second through-hole is formed in the light-shielding layer that runs through the light-shielding layer and communicates with the second grid groove, and the second through-hole is filled with a conductive material that is electrically connected to the conductive material of the second conductive layer,
   wherein the first grid groove and the second grid groove have a width of 1 to 5 microns, a depth of 2 to 6 microns, and a depth-to-width ratio of greater than 1, the first conductive layer and the second conductive layer have a transmittance of greater than 85%, and the first matrix layer and the second continuous matrix layer are a single layer, respectively.

2. The conductive film according to claim 1, wherein a thickness of the first conductive layer is not greater than a depth of the first grid groove, and a thickness of the second conductive layer is not greater than a depth of the second grid groove.

3. The conductive film according to claim 1, wherein the conductive material is silver.

4. The conductive film according to claim 1, wherein the light-shielding layer has a thickness of 1 to 10 microns.

5. The conductive film according to claim 4, wherein the light-shielding layer is an ink layer or a black photoresist layer.

6. The conductive film according to claim 1, wherein the substrate is glass.

7. The conductive film according to claim 1, wherein grids of the first grid groove and the second grid groove are random grids.

8. A touch screen comprising:
   a conductive film according to claim 1; and
   a display module adhered to a side of the second continuous matrix layer away from the first matrix layer by optical glue.

9. A method for manufacturing a conductive film, comprising the following steps:
   providing a substrate having a first surface and a second surface opposite to the first surface;
   coating the first surface of the substrate with a gel, curing the gel to form a first matrix layer, and forming a first grid groove on a side of the first matrix layer that is away from the substrate;
   filling the first grid groove with a conductive material to form a first conductive layer;

coating a gel on a side of the first matrix layer that is away from the substrate, curing the gel to form a second matrix layer, and forming a second grid groove in the second matrix layer;

filling the second grid groove with a conductive material to form a second conductive layer;

coating a light-shielding material on an edge of a side of the second matrix layer that is away from the first matrix layer, to form an annular light-shielding layer;

forming a first through-hole and a second through-hole in the light-shielding layer, with the first through-hole communicating with the first grid groove, and the second through-hole communicating with the second grid groove;

filling the first through-hole and the second through-hole with a conductive material, to respectively form a first lead electrode that is electrically connected to the first conductive layer and a second lead electrode that is electrically connected to the second conductive layer.

* * * * *